United States Patent
Blödt et al.

(10) Patent No.: US 12,241,853 B2
(45) Date of Patent: Mar. 4, 2025

(54) DIELECTRIC-CONSTANT MEASURING DEVICE

(71) Applicant: Endress+Hauser SE+Co. KG, Maulburg (DE)

(72) Inventors: Thomas Blödt, Steinen (DE); Pablo Ottersbach, Essen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 150 days.

(21) Appl. No.: 18/040,998

(22) PCT Filed: Jul. 22, 2021

(86) PCT No.: PCT/EP2021/070511
§ 371 (c)(1),
(2) Date: Feb. 8, 2023

(87) PCT Pub. No.: WO2022/033831
PCT Pub. Date: Feb. 17, 2022

(65) Prior Publication Data
US 2023/0266262 A1    Aug. 24, 2023

(30) Foreign Application Priority Data
Aug. 11, 2020  (DE) ............... 10 2020 121 154.6

(51) Int. Cl.
*G01N 27/22*  (2006.01)
*G01N 22/00*  (2006.01)
*G01R 27/26*  (2006.01)

(52) U.S. Cl.
CPC .......... *G01N 27/221* (2013.01); *G01N 22/00* (2013.01); *G01R 27/2635* (2013.01)

(58) Field of Classification Search
None
See application file for complete search history.

(56) References Cited

U.S. PATENT DOCUMENTS

| | | |
|---|---|---|
| 2003/0117150 A1 | 6/2003 | Noik et al. |
| 2010/0031753 A1* | 2/2010 | Mayer .................. G01F 1/663 |
| | | 73/290 R |

(Continued)

FOREIGN PATENT DOCUMENTS

| | | |
|---|---|---|
| DE | 102015112543 A1 | 2/2017 |
| DE | 102017130728 A1 | 6/2019 |

(Continued)

*Primary Examiner* — Jermele M Hollington
(74) *Attorney, Agent, or Firm* — Mark A. Logan; Endress+Hauser (USA) Holding, Inc.

(57) ABSTRACT

A high-frequency-based measuring device for determining a dielectric constant of a medium comprises a signal-generating unit for coupling an electrical high-frequency signal into a transmitting electrode located in the medium, the transmitting electrode having a depth of at most one quarter of the wavelength of the high-frequency signal; a receiving electrode likewise located in the medium and located a distance from the transmitting electrode of at most one quarter of the wavelength of the high-frequency signal, for receiving the high-frequency signal after the same has passed through the medium; and an evaluation unit designed to determine the dielectric constant on the basis of the received high-frequency signal.

11 Claims, 4 Drawing Sheets

(56) References Cited

U.S. PATENT DOCUMENTS

| | | | |
|---|---|---|---|
| 2010/0176813 A1* | 7/2010 | Simon | G01V 3/30 |
| | | | 324/339 |
| 2012/0310541 A1* | 12/2012 | Katz | G01N 22/00 |
| | | | 702/19 |
| 2019/0187071 A1* | 6/2019 | Blödt | G01N 22/00 |
| 2022/0283210 A1* | 9/2022 | Blödt | G01R 27/2682 |
| 2022/0381703 A1* | 12/2022 | Blodt et al. | G01F 23/2845 |
| 2023/0003667 A1* | 1/2023 | Blodt | G01N 22/00 |

FOREIGN PATENT DOCUMENTS

| | | |
|---|---|---|
| DE | 102018130260 A1 | 6/2020 |
| DE | 102019101598 A1 | 7/2020 |
| DE | 102019102142 A1 | 7/2020 |
| EP | 1983357 A1 | 10/2008 |
| WO | 2011064770 A2 | 6/2011 |

* cited by examiner

DIELECTRIC-CONSTANT MEASURING DEVICE

CROSS-REFERENCE TO RELATED APPLICATIONS

The present application is related to and claims the priority benefit of DPMA Patent Application No. 10 2020 121 154.6, filed on Aug. 11, 2020, and International Patent Application No. PCT/EP2021/070511, filed on Jul. 22, 2021, the entire contents of which are incorporated herein by reference.

TECHNICAL FIELD

The invention relates to a high-frequency-based measuring device for determining a dielectric constant of a medium.

BACKGROUND

In automation technology, especially for process automation, field devices are often used, which serve to detect various measured variables. The measured variable to be determined may, for example, be a fill-level, a flow, a pressure, the temperature, the pH, the redox potential, a conductivity, or the dielectric constant of a medium in a process plant. In order to detect the corresponding measured values, the field devices each comprise suitable sensors or are based upon suitable measuring methods. A variety of different types of field devices are produced and marketed by the Endress+Hauser group of companies.

The determination of the dielectric constant (also known as "dielectric coefficient" or "relative permittivity") is of particular interest both in solids and in liquid and gaseous fillers, such as propellants, wastewater, gases, gas phases, or chemicals, since this value can constitute a reliable indicator of impurities, the moisture content, the concentration, or the composition of substances.

The dielectric constant of a medium can, for example, be determined in a high-frequency technical manner by measuring the amplitude, the phase shift, or the signal propagation time of high-frequency signals when passing through the medium. For this purpose, a high-frequency signal of a defined frequency or within a defined frequency band is coupled into the medium; after passing through the medium, the high-frequency signal is evaluated with regard to its amplitude, phase position, or signal propagation time with respect to the emitted high-frequency signal. The term, "high-frequency signal," in the context of this patent application refers to corresponding signals with frequencies between 10 MHz and 150 GHz.

A phase-based dielectric-constant measuring device is described in DE 10 2017 130728 A1, for example. In this case, the effect is used that the signal propagation time of the high-frequency signal and thus the phase position along a measuring probe depends upon the dielectric constant of the medium prevailing along the measuring probe. In principle, a distinction is drawn between a relative and an absolute phase measurement, wherein, in the case of an absolute phase measurement, a so-called quadrant correction is additionally carried out.

For determining the dielectric constant by measuring the propagation time of high-frequency signals, the TDR principle ("time domain reflectometry") may be used, for example. In this measuring principle, a signal-generating unit transmits a high-frequency signal at a frequency between 0.1 GHz and 150 GHz in a pulse-like manner along an electrically-conductive measuring probe and measures the signal propagation time of the high-frequency pulse until its reception after reflection at the probe end. In this case, the effect is used according to which the pulse propagation time is dependent upon the dielectric constant of the substance surrounding the measuring probe. The functional principle of TDR sensors is described, for example, in publication EP 0622 628 A2. TDR sensors are sold in numerous embodiments—for example, by IMKO Mikromodultechnik GmbH. The advantage of TDR sensors is that, in particular in the case of low dielectric constants between 1 and 10, high measurement accuracy can be achieved even with a small measuring probe.

In the case of hygienically sensitive applications, such as in the pharmaceutical or food industry, the medium whose dielectric constant is to be determined often has a high moisture content, so that the dielectric constant to be determined is in a high range between 60 and 85. For known high-frequency-based measuring methods, such as the TDR method, this means, however, that the measuring probe must be designed in this case with correspondingly large dimensions in order to be able to achieve sufficient measurement accuracy. Since flow pipes and process containers in the pharmaceutical and food industry are often very small, however, the dielectric-constant measuring device must also be correspondingly compact in order to be able to be attached to small process connectors, such as, for example, a flange of the size DN50.

SUMMARY

The object of the invention is therefore to provide a compact measuring device for determining the dielectric constant, by means of which the dielectric constant of media with, in particular, a high moisture content can be determined with high accuracy.

The invention achieves this object by a high-frequency-based measuring device for determining a dielectric constant of a medium, wherein the measuring device comprises the following components:

a signal-generating unit which is designed to couple an electrical high-frequency signal with a defined frequency into a transmitting electrode which can be located in the medium, wherein the transmitting electrode, for emitting the high-frequency signal, has a depth of at most one-quarter, and in particular at most one-eighth, of the wavelength corresponding to the frequency of the high-frequency signal, a receiving electrode which can be located in the medium and which is located at a distance from the transmitting electrode of at most one-quarter and preferably at least one-sixteenth of the wavelength corresponding to the frequency of the high-frequency signal in order to receive the high-frequency signal after passage through the medium, and an evaluation unit connected to the receiving electrode, which evaluation unit is designed to determine the dielectric constant of the medium on the basis of at least the received high-frequency signal.

By means of this dimensioning and arrangement, according to the invention, of the electrodes in relation to the wavelength of the high-frequency signal, the measurement accuracy or the measurement sensitivity of the dielectric constant measurement can, for one, be maximized, and, at the same time, a compact design of the measuring device can be achieved.

In the context of the invention, the term, "unit," in principle refers to any electronic circuit that is designed in a manner suitable for the intended purpose. Depending upon the requirement, it can therefore be an analog circuit for generating or processing corresponding analog signals. However, it may also be a digital circuit, such as an FPGA, or a storage medium in interaction with a program. In this case, the program is designed to perform the corresponding method steps or to apply the necessary calculation operations of the respective unit. In this context, various electronic units of the measuring device in the sense of the invention can potentially also access a common physical memory or be operated by means of the same physical digital circuit.

By means of the measuring device, the dielectric constant can be determined as a complex value, e.g., by the evaluation unit being designed to determine an imaginary part of the dielectric constant on the basis of an amplitude of the received high-frequency signal and/or to determine a real part of the dielectric constant on the basis of a signal propagation time or a phase position of the received high-frequency signal. The determination of the signal propagation time can, corresponding to radar-based distance measurement, take place, for example, by means of the pulse propagation-time method or the FMCW method. In these cases, the signal-generating unit and the evaluation unit are to be designed accordingly, in order to determine the signal propagation time of the high-frequency signal through the medium by means of a pulse propagation-time method or the FMCW method.

The form of the cross-section of the electrodes is not strictly prescribed within the scope of the invention; in order to achieve simple manufacture, the transmitting electrode and the receiving electrode can have, for example, a round or an elliptical cross-section. Alternatively, the transmitting electrode and the receiving electrode can be designed with a rectangular cross-section and arranged parallel to one another. As a result, the measuring device can be used, for example, in pipeline sections with flowing media, due to the, fluid-technically, potentially favorable shape of the electrodes. If a largest possible measurement accuracy is desired, the transmitting electrode or the receiving electrode can in turn be designed with an annular cross-section, wherein the respective other electrode is designed with a round cross-section and is arranged centrally within the annular electrode. For hygienic protection against deposits or for optimizing the flow resistance, the transmitting electrode and/or the receiving electrode can also have a rounded electrode end. In this regard, it is also advantageous if the transmitting electrode and/or the receiving electrode taper/tapers with increasing depth, in particular in conically.

Since the dielectric constant, in particular of moisture-containing media, is highly temperature-dependent, a temperature sensor, such as a capacitive sensor or a resistance-based sensor, can, for temperature compensation of the dielectric constant measurement, be arranged in the interior of the transmitting electrode or in the interior of the receiving electrode. Accordingly, the evaluation unit can, with a suitable design, determine the dielectric constant of the medium in a temperature-compensated manner on the basis of the temperature sensor—for example, on the basis of a look-up table or a compensation function.

The frequency of the high-frequency signal should in principle be selected as a function of the dielectric constant measurement range. In the case of a measuring range of the dielectric constant between 60 and 90, i.e., in the case of highly humid media, the signal-generating unit of the measuring device is to be designed such as to generate the electrical high-frequency signal corresponding to this measurement range at a frequency between 2 GHz and 8 GHz. Similarly, the evaluation unit is also to be designed such that it can process and evaluate the received high-frequency signal at the corresponding frequency.

Corresponding to the dielectric-constant measuring device according to the invention, according to one of the previously described embodiment variants, the object upon which the invention is based is also achieved by a corresponding method for operating the measuring device. Accordingly, the method comprises at least the following steps:

coupling the high-frequency signal into the transmitting electrode, decoupling the high-frequency signal from the receiving electrode after passage through the medium, and determining the dielectric constant on the basis of at least the received high-frequency signal.

BRIEF DESCRIPTION OF THE DRAWINGS

The invention is explained in more detail with reference to the following figures. The following are shown.

DETAILED DESCRIPTION

Figure 1:
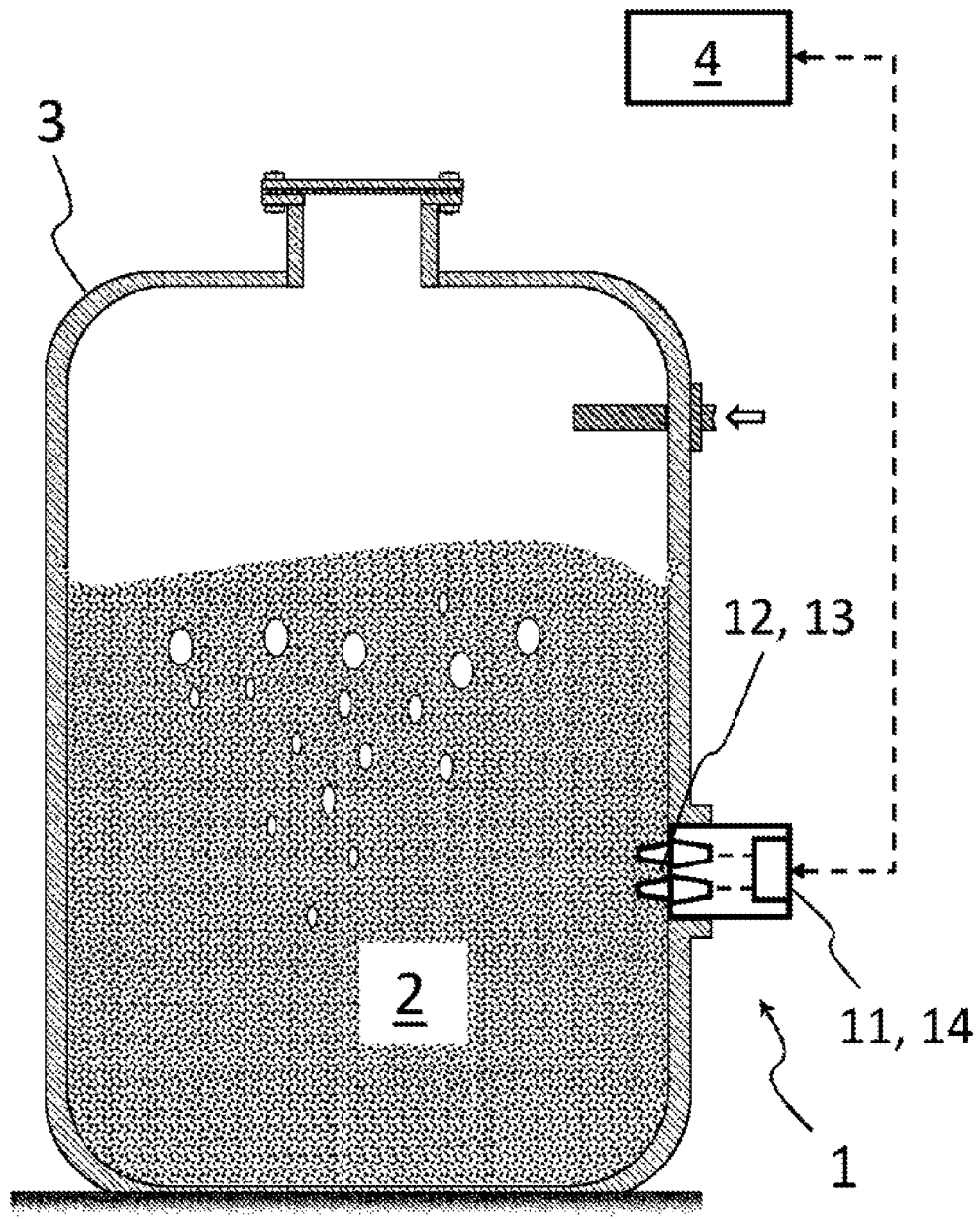
FIG. 1 shows a dielectric-constant measuring device according to the present disclosure on a container.

In order to understand the dielectric-constant measuring device 1 according to the invention, a schematic arrangement of the measuring device 1 on a container 3 is shown in FIG. 1: In this case, the container 3 is filled with a medium 2, the dielectric constant of which is to be determined. In order to be able to determine the dielectric constant of the medium 2, the measuring device 1 is fastened via a lateral external connector of the container 3, such as a flange of the size DN50, in such a way that it communicates with the container interior or the medium 2. Optionally, the measuring device 1 may be in contact with a superordinate unit 4, such as a process control system. A "PROFIBUS," "HART," or "wireless HART" interface can be implemented, for example. In this way, the dielectric constant of the medium 2 can be transmitted, for example, as a magnitude or as a complex value with a real part and an imaginary part. However, other information about the general operating state of the measuring device 1 can also be communicated.

The measuring device 1 according to the invention determines the dielectric constant of the medium 2 transmissively, i.e., by high-frequency signals $s_{HF}$ being emitted via a transmitting electrode 12 and being received subsequently by a receiving electrode 13, so that the medium 2 is irradiated over a defined measurement distance d. As can be seen from FIG. 1, the electrodes 12, 13 project, for this purpose, up to a defined depth h into the container interior or medium 2. The high-frequency signal $s_{HF}$ is generated in a signal-generating unit 11, designed for this purpose, of the measuring device 1. Within the scope of the invention, it is irrelevant whether the electrodes 12, 13 are made completely of a conductive material, such as, for example, turned stainless steel, or whether the electrodes 12, 13 merely have an electrically-conductive surface coating. A possible metallization of the electrode surface can, for example, be carried out by means of plasma coating such as PECVD ("plasma enhanced vapor deposition").

Based upon the amplitude of the received high-frequency signal $s_{HF}$, an evaluation unit 14 of the measuring device 1 can determine the real part of the dielectric constant. Based upon the signal propagation time or the phase position of the received high-frequency signal $s_{HF}$, the real part of the dielectric constant can be determined. In this case, the pulse propagation-time method or the FMCW method can be implemented as measuring principles for determining the signal propagation time, analogously to radar-based distance measurement. Accordingly, the signal-generating unit 11 and the evaluation unit 14 are to be designed according to the respective measuring principle.

Particularly in the food or pharmaceutical industries, the medium 2 can be composed of highly water-containing fluids such as beverages or vaccines. Accordingly, in these cases, the dielectric constant range to be detected is between 60 and 90. Corresponding to this range, the signal-generating unit 11 is designed to generate the high-frequency signal $s_{HF}$ at a frequency f between 2 GHz and 8 GHz.

In order to achieve a high resolution also in this dielectric constant range, according to the invention, only the near field of the high-frequency signal $s_{HF}$ is emitted via the transmitting electrode 12. The low attenuation in media 2 with high dielectric constants and the associated high measuring sensitivity are advantageous in this case. In addition, disruptive effects of the far field are avoided, such as, for example, undesired reflections on the inner wall of the container 2, whereby the measurement can be distorted. As is shown in more detail in the cross-sectional view in FIG. 2, the transmitting electrode 12 is therefore designed for predominant irradiation in the near field with a depth h, which, according to $$c = \frac{f * \lambda}{\sqrt{DK}}$$

is significantly smaller than one-quarter of the wavelength $\lambda$ of the high-frequency signal $s_{HF}$, and thus, for example, one-eighth of the wavelength $\lambda$. Here, c is the propagation speed of the high-frequency signal $s_{HF}$ in the medium 2, i.e., light speed; DK is the dielectric constant of the medium 2. The definition of the electrode depth h according to the invention ensures that the measuring device 1 can be designed with compact dimensions, so that it can also be attached to small container openings. The depth h of the electrodes 12, 13 in this case relates to a wall 16, facing the medium or container interior, of the measuring device 1, which wall is planar and which, in the illustrated embodiment also provides a signal mass for the high-frequency signal $s_{HF}$. Accordingly, the wall 16 can be manufactured, for example, from stainless steel.

A minimal depth h of the electrodes 12, 13 in relation to the wall 16 is not fixedly predefined within the scope of the invention. In principle, it is even conceivable that the electrodes 12, 13 not protrude beyond the wall 16 into the container interior. However, a higher sensitivity of the dielectric constant measurement is, advantageously, achieved when the depth h of the electrodes 12, 13 is greater than zero.

Figure 2:
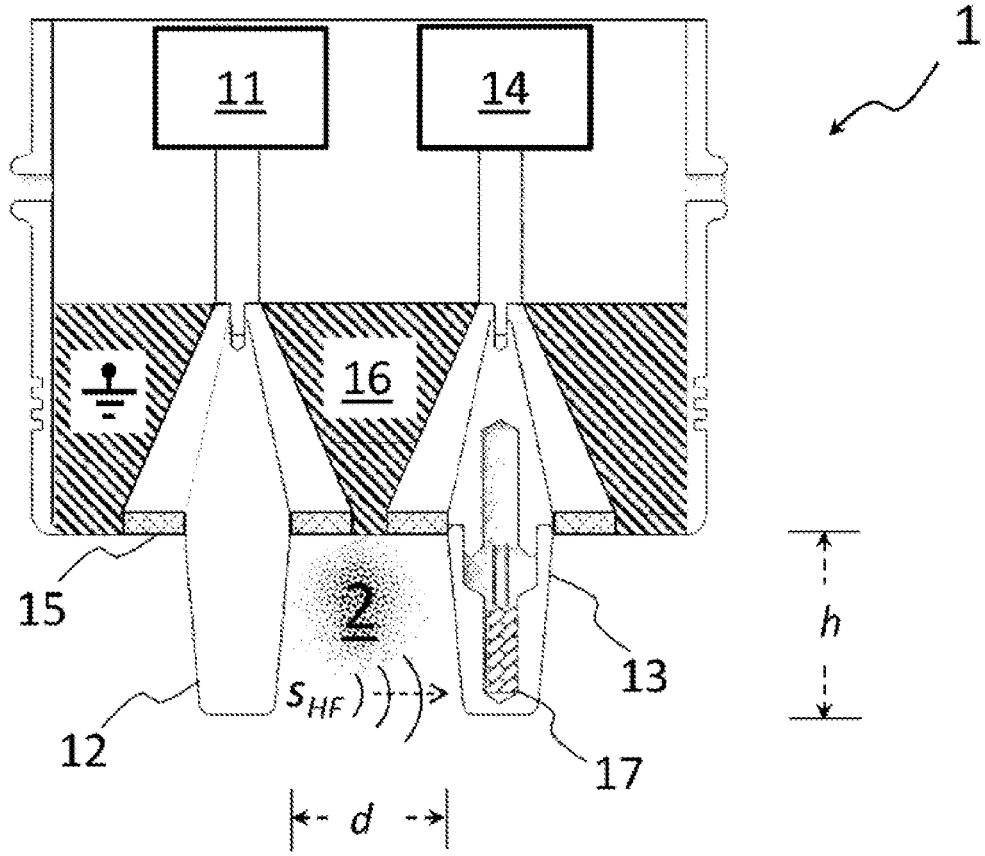
FIG. 2 shows a cross-sectional view of the measuring device according to the present disclosure.
Figure 6:
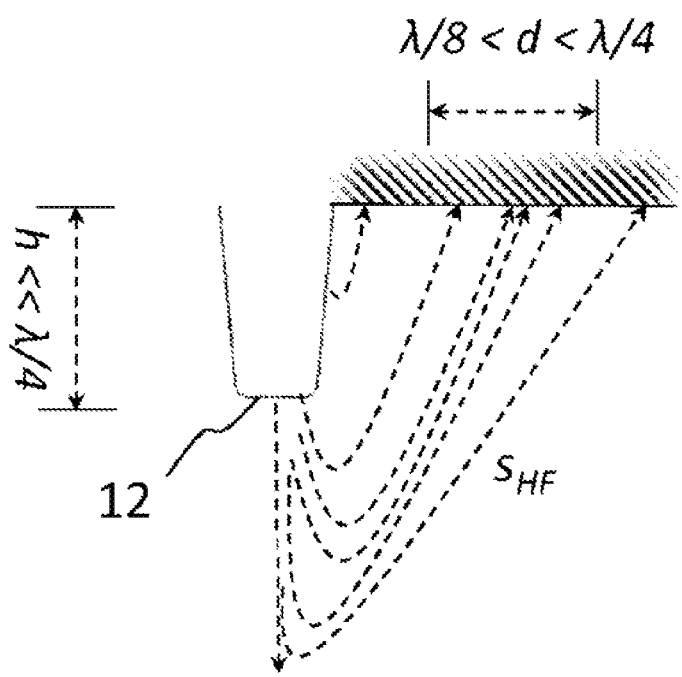
FIG. 6 shows a schematic field distribution at the transmitting electrode.

As is also indicated in FIG. 2, the distance d between the transmitting electrode 12 and the receiving electrode 13 according to the invention is at most one-quarter and at least one-eighth of the wavelength $\lambda$, which, according to the above formula, corresponds to the frequency f of the high-frequency signal $s_{HF}$. This takes advantage of the effect that the transmitting electrode 12 emits the high-frequency signal $s_{HF}$ at this distance $\lambda/8 < d \lambda/4$ with the highest field density, as is outlined in FIG. 6.

The distance "d" refers to the distance between those two points on the surfaces of the electrodes 12, 13 which are at the smallest distance from one another.

This positioning of the receiving electrode 13 with respect to the transmitting electrode 12 causes the sensitivity of the dielectric constant measurement to be maximized. This effect is supported when both electrodes 12, 13 have the same geometry or depth h, and/or taper conically with increasing depth h, as is the case in FIG. 2. In the embodiment shown in FIG. 2, both electrodes 12, 13 also each have a rounded electrode end. This is advantageous in particular in the case of hygienic applications in which medium deposits are to be avoided. Also, for applications in which the medium 2 is not stored in a stationary manner within the container 3, e.g., when it flows through a pipeline section, this design of the electrodes 12, 13 is advantageous for suppressing the formation of vortices in the pipeline section, provided that the measuring device is arranged there.

The electrodes 12, 13 are each electrically insulated by an insulation 15, which separates the respective electrode 12, 13 from the wall 16. The electrical insulation 15 can be realized, for example, as an injection-molded part. For example, PP, PTFE, PEEK, or a ceramic material, such as aluminum oxide, can be used as the material. In the exemplary embodiment shown in FIG. 2, the two insulation elements 15 are designed such that they are flush with the wall 16 towards the medium 2. In addition, it can be seen from FIG. 2 that the insulations 15 of the electrodes 12, 13 are in turn separated by the wall 16 acting as a signal mass. This achieves the additional advantageous effect that the high-frequency signal $s_{HF}$ has to propagate completely through the medium 2 without being able to at least partially directly couple from the transmitting electrode 12 into the receiving electrode 12. Thus, the sensitivity of the measurement is further increased.

In the embodiment of the measuring device 1 shown in FIG. 2, a gap is introduced at the rear, in relation to the planar surface, between the respective electrode 12, 13 and the wall 16. In contrast to this illustration, an electrically-insulating filling with a dielectric constant greater than one, e.g., of PEEK, PP, PE, or PTFE, can also be introduced into this gap. As a result, the dimensions of the respective electrode 12, 13 in relation to the depth h thereof can be further reduced without the sensitivity of the dielectric constant measurement being reduced, since the effective wavelength $\lambda$ of the high-frequency signal $s_{HF}$ is reduced in the case of dielectric filling of the gap.

For temperature compensation of the dielectric constant measurement, in the embodiment variant according to FIG. 2, a temperature sensor 17 is arranged in the receiving electrode 13. Due to the depth h of the receiving electrode 13, the temperature sensor 17 projects beyond the container wall in the mounted state of the measuring device 1, so that the current medium temperature can be measured. In this optional embodiment, the evaluation unit 14 is designed to compensate for the measured dielectric constant of the medium 2 on the basis of the measured temperature—for example, by means of a compensation function. The temperature sensor 17 can be designed as a capacitive sensor or as a resistance-based sensor, and in particular as a PT1000. In contrast to the illustration shown, it is also possible to arrange an optional temperature sensor 17 in the transmitting electrode 12.

Figure 3:
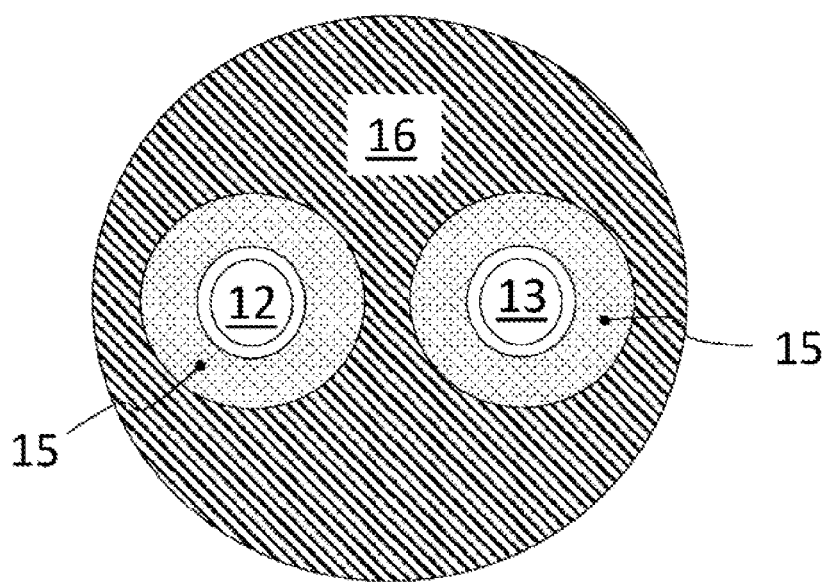
FIG. 3 shows a front view of a first variant of the measuring device.
Figure 4:
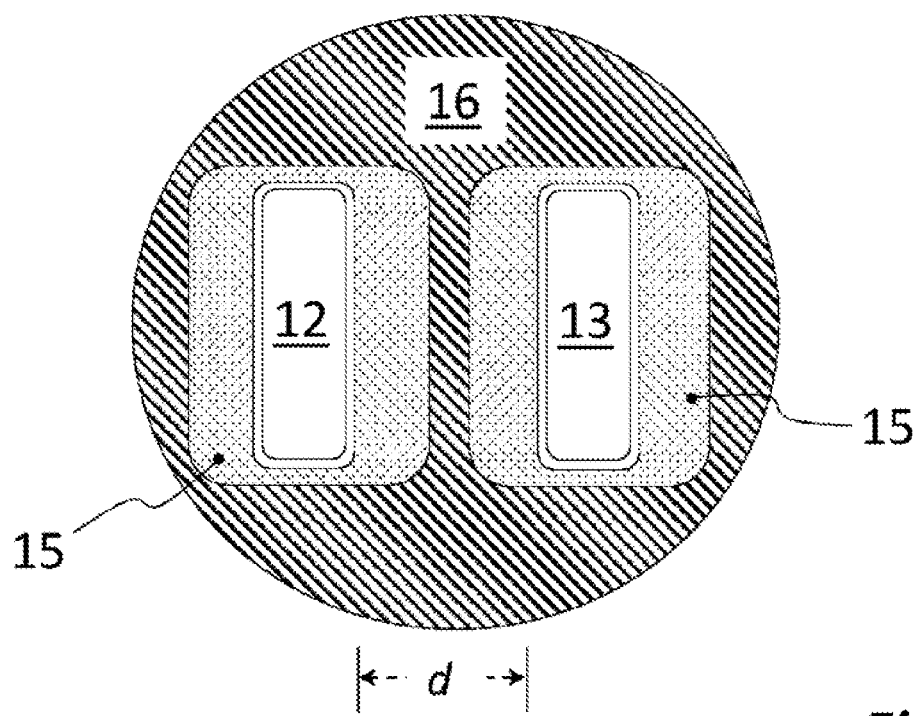
FIG. 4 shows a front view of a second variant of the measuring device.
Figure 5:
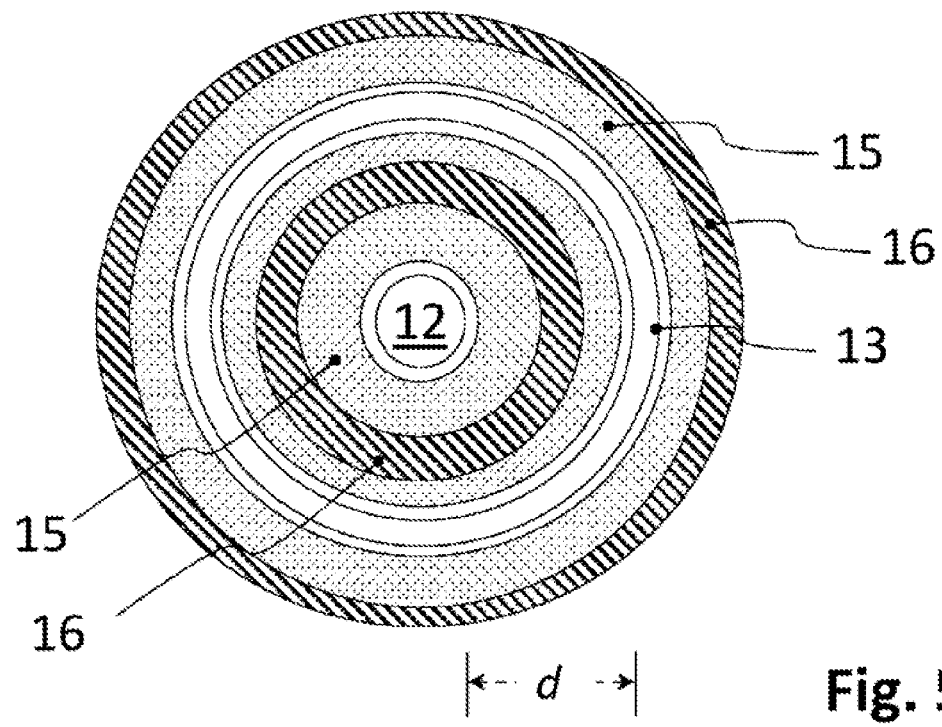
FIG. 5 shows a front view of a third variant of the measuring device.

The cross-sectional shape of the electrodes 12, 14 is not fixedly predefined within the scope of the invention. In FIGS. 3 through 5, various implementations are therefore shown in a front view (in relation to the plane of the planar wall 16): In the embodiment shown in FIG. 3, the transmitting electrode 12 and the receiving electrode 13 each have a round cross-section. In this embodiment, the electrodes 12, 13 can be manufactured with little effort—for example, by turning a stainless-steel blank.

As an alternative to a round cross-section, FIG. 4 shows a rectangular cross-sectional shape of the electrodes 12, 13, which can be used, for example, in pipes with flowing medium 2. In this case, the electrodes 12, 13 are arranged—in relation to the rectangular shape—parallel to one another at a distance d, so that they represent, with a corresponding alignment, a minimized flow resistance in flowing media 2. In accordance with the embodiment shown in FIG. 4, it is also of course conceivable to round the rectangular cross-section of the electrodes 12, 13 or to further optimize it fluidically.

In the embodiment of the electrodes 12, 13 shown in FIG. 5, the receiving electrode 13 is designed with an annular cross-section, while the transmitting electrode 12 has a round cross-section and is arranged centrally within the receiving electrode 13. In this case, the radius of the annular receiving electrode 13 is dimensioned such that the radial distance d from the central transmitting electrode 12 is again at most λ/4. An advantage of this embodiment variant of the electrodes 12, 13 is a potentially very high measurement accuracy or measurement sensitivity of the dielectric-constant measurement. In contrast to the embodiment variant shown in FIG. 5, this advantage is also achievable when, instead of the receiving electrode 13, the transmitting electrode 12 is of annular design, and the receiving electrode 13 has a round cross-section and is arranged centrally within the transmitting electrode 12.

The invention claimed is:

1. A high-frequency-based measuring device for determining a dielectric constant of a medium, comprising:
    a signal-generating unit embodied to generate an electrical high-frequency signal at a defined frequency;
    a transmitting electrode embodied to be located in the medium, wherein the transmitting electrode, for emitting a high-frequency signal, has a depth of at most one-quarter of a wavelength corresponding to the defined frequency of the electrical high-frequency signal;
    a receiving electrode embodied to be located in the medium, wherein the receiving electrode is located at a distance from the transmitting electrode of at most one-quarter of the wavelength corresponding to the frequency of the electrical high-frequency signal, in order to receive the emitted high-frequency signal after passage of the emitted high-frequency signal through the medium; and
    an evaluation unit connected to the receiving electrode and designed to determine the dielectric constant of the medium based at least upon the received high-frequency signal,
    wherein a temperature sensor is arranged in the interior of the transmitting electrode or in the interior of the receiving electrode, and wherein the evaluation unit is designed to determine the dielectric constant of the medium in a temperature-compensated manner on the basis of the temperature sensor.

2. The high-frequency-based measuring device according to claim 1, wherein the evaluation unit is configured to determine an imaginary part of the dielectric constant on the basis of an amplitude of the received high-frequency signal and/or to determine a real part of the dielectric constant on the basis of a signal propagation time or a phase position of the received high-frequency signal.

3. The high-frequency-based measuring device according to claim 1, wherein the transmitting electrode and/or the receiving electrode, for emitting the high-frequency signal, has/have a depth of at most one-eighth of the wavelength corresponding to the frequency of the electrical high-frequency signal.

4. The high-frequency-based measuring device according to claim 1, wherein the distance of the receiving electrode from the transmitting electrode is at least one-sixteenth of the wavelength corresponding to the frequency of the electrical high-frequency signal.

5. The high-frequency-based measuring device according to claim 1, wherein the transmitting electrode and the receiving electrode each has a round or an elliptical cross-section.

6. The high-frequency-based measuring device according to claim 1, wherein the transmitting electrode and the receiving electrode each has a rectangular cross-section, and the transmitting electrode and the receiving electrode are arranged parallel to one another.

7. The high-frequency-based measuring device according to claim 1, wherein the transmitting electrode or the receiving electrode is designed with an annular cross-section, and the other electrode is designed with a round cross-section and is arranged centrally within the annular electrode.

8. The high-frequency-based measuring device according to claim 1, wherein the transmitting electrode and/or the receiving electrode have/has a rounded electrode end.

9. The high-frequency-based measuring device according to claim 1, wherein the transmitting electrode and/or the receiving electrode taper with increasing depth.

10. The high-frequency-based measuring device according to claim 1, wherein the signal-generating unit is designed to generate the electrical high-frequency signal at a frequency between 0.1 GHz and 30 GHz.

11. A method for determining a dielectric constant of a medium, the method comprising:
    providing a high-frequency-based measuring device for determining the dielectric constant of the medium, including:
        a signal-generating unit embodied to generate an electrical high-frequency signal at a defined frequency;
        a transmitting electrode embodied to be located in the medium, wherein the transmitting electrode, for emitting a high-frequency signal, has a depth of at most one-quarter of a wavelength corresponding to the defined frequency of the electrical high-frequency signal;
        a receiving electrode embodied to be located in the medium, wherein the receiving electrode is located at a distance from the transmitting electrode of at most one-quarter of the wavelength corresponding to the frequency of the electrical high-frequency signal, in order to receive the emitted high-frequency signal after passage of the emitted high-frequency signal through the medium; and an evaluation unit connected to the receiving electrode and designed to determine the dielectric constant of the medium based at least upon the received high-frequency signal, wherein a temperature sensor is arranged in the interior of the transmitting electrode or in the interior of the receiving electrode, and wherein the evaluation unit is designed to determine the dielectric constant of the medium in a temperature-compensated manner on the basis of the temperature sensor;

coupling the electrical high-frequency signal into the transmitting electrode;

emitting a high-frequency signal into the medium from the transmitting electrode;

decoupling a high-frequency received signal from the receiving electrode after passage of the emitted high-frequency signal through the medium; and determining the dielectric constant on the basis of at least the received high-frequency signal.

* * * * *